United States Patent
Chen et al.

(10) Patent No.: US 9,013,038 B2
(45) Date of Patent: Apr. 21, 2015

(54) SEMICONDUCTOR DEVICE WITH POST-PASSIVATION INTERCONNECT STRUCTURE AND METHOD OF FORMING THE SAME

(71) Applicant: Taiwan Semiconductor Manufacturing Company, Ltd., Hsin-Chu (TW)

(72) Inventors: Hsien-Wei Chen, Hsin-Chu (TW); Tsung-Yuan Yu, Taipei (TW); Hao-Yi Tsai, Hsin-Chu (TW); Mirng-Ji Lii, Sinpu Township (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/870,674

(22) Filed: Apr. 25, 2013

(65) Prior Publication Data
US 2014/0264837 A1    Sep. 18, 2014

Related U.S. Application Data

(60) Provisional application No. 61/790,958, filed on Mar. 15, 2013.

(51) Int. Cl.
 *H01L 23/48*  (2006.01)
 *H01L 23/498*  (2006.01)
 *H01L 23/00*  (2006.01)

(52) U.S. Cl.
 CPC .......... *H01L 23/49811* (2013.01); *H01L 24/11* (2013.01)

(58) Field of Classification Search
 USPC .......................................... 257/734, 737, 738
 See application file for complete search history.

(56) References Cited

U.S. PATENT DOCUMENTS

| | | | |
|---|---|---|---|
| 8,581,389 B2 | 11/2013 | Chen et al. | |
| 2003/0136979 A1 | 7/2003 | Cho et al. | |
| 2012/0299167 A1 | 11/2012 | Chen et al. | |

FOREIGN PATENT DOCUMENTS

DE    102006037587    2/2008

*Primary Examiner* — Long Pham
(74) *Attorney, Agent, or Firm* — Slater & Matsil, L.L.P.

(57) ABSTRACT

A semiconductor device, including a protective layer overlying a contact pad and a dummy pad on a semiconductor substrate, an interconnect structure overlying the protective layer and contacting part of the dummy pad through a contact via passing through the protective layer, a bump overlying the interconnect structure positioned over the dummy pad.

18 Claims, 9 Drawing Sheets

SEMICONDUCTOR DEVICE WITH POST-PASSIVATION INTERCONNECT STRUCTURE AND METHOD OF FORMING THE SAME

This application claims priority to U.S. Provisional Application Ser. No. 61/790,958, filed on Mar. 15, 2013, entitled "SEMICONDUCTOR DEVICE WITH POST-PASSIVATION INTERCONNECT STRUCTURE AND METHOD OF FORMING THE SAME," which application is hereby incorporated herein by reference.

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packaging for semiconductor devices that has been developed is wafer level packaging (WLP), in which integrated circuit die are packaged in packages that typically include a post-passivation interconnect (PPI) structure or a redistribution layer (RDL) that is used to fan out wiring for contact pads of the integrated circuit die so that electrical contact can be made on a larger pitch or pad than contact pads of the die. WLP packages have been applied more and more in integrated circuit packaging due to the advantages of their simple structures. However, for some WLP packages, the under bump metallization (UBM) layers used in WLP packages can be costly. For some other low cost WLP packages without UBM layers, adhesion between connection devices such as solder balls and PPI structures can cause problems such as a higher incidence of ball cracks. The design of low cost WLP packages without UBM layers while increasing adhesion between connection devices such as solder balls and PPI structure is a challenge.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

The making and using of the presented embodiments are discussed in detail below. It should be appreciated, however, that the present disclosure provides many applicable concepts that can be embodied in a wide variety of specific contexts. The specific embodiments discussed are merely illustrative of specific ways to make and use the described conductive interconnect or joint (an "interconnect"), and do not limit the scope of the disclosure.

Embodiments will be described with respect to a specific context, namely making and using interconnects useful in, for example, fan-in or fan-out wafer level packaging or WLCSP assemblies. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

The embodiments of the present disclosure are described with reference to FIGS. 1 through 9, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

Figure 1:
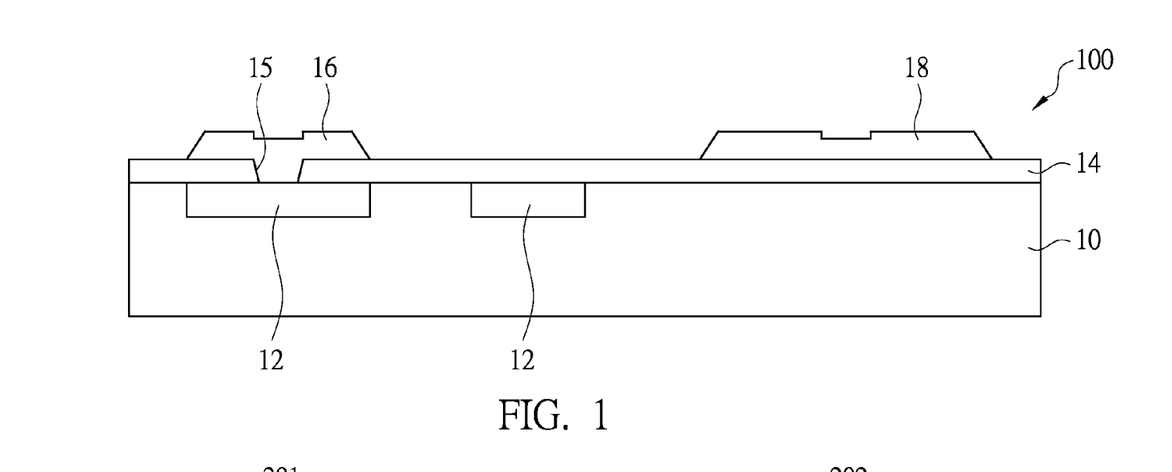
FIGS. 1 through 4 illustrate cross-sectional views of intermediate steps in forming a post-passivation interconnect (PPI) structure according to an embodiment.

FIG. 1 is a cross-sectional view illustrating formation of a semiconductor device 100 including a contact pad 16 and a dummy pad 18 overlying a semiconductor substrate 10 according to an embodiment.

The semiconductor substrate 10 is made of silicon or other bulk semiconductor material. The semiconductor substrate 10 can be a wafer, a die or a part of a base semiconductor wafer. Active and passive devices, conductive layers, and dielectric layers can be formed in or on the semiconductor substrate 10 according to the electrical design of the die. In an embodiment, the semiconductor substrate 10 includes a top-level metal layer 12 and a top-level dielectric layer 14 overlying the metal layer 12, in which the dielectric layer 14 includes a patterned opening 15 exposing part of the metal layer 12. The opening 15 is a window used for electrically connecting subsequently formed contact pads and interconnect structures. In an embodiment, a contact pad 16 and a dummy pad 18 spaced apart are then formed at the same level on the dielectric layer 14. The contact pad 16 is electrically connected to the metal layer 12 through the opening 15 of the dielectric layer 14, while the dummy pad 18 is formed on the dielectric layer 14 without serving electrical connection between the semiconductor substrate 10 and any other connector or substrate. In some embodiments, the contact pad 16 and the dummy pad 18 are formed of a conductive material, such as aluminum (Al), copper (Cu), Al alloy, Cu alloy, or another like material.

Figure 2:
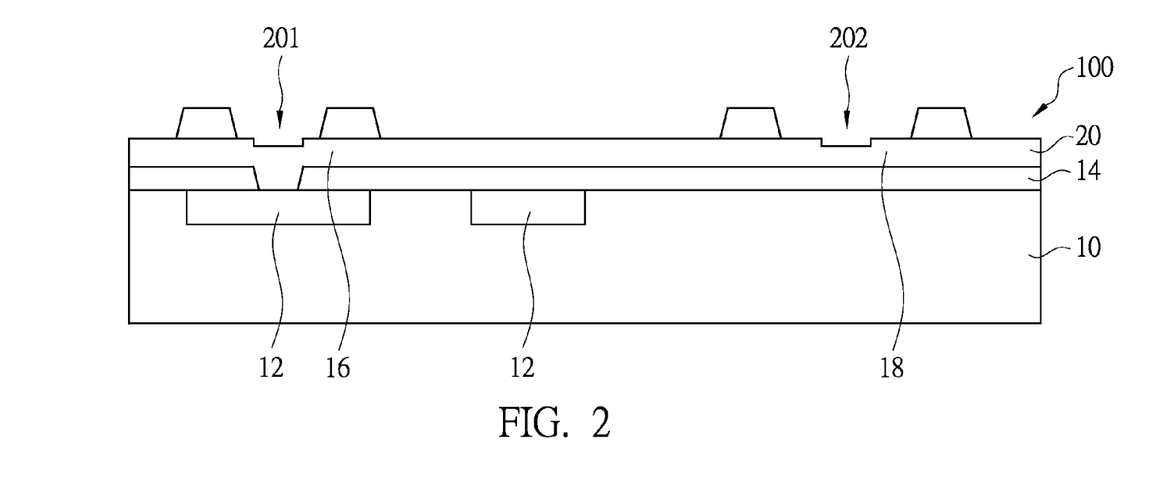

FIG. 2 is a cross-sectional view illustrating formation of a passivation layer 20 according to an embodiment.

The passivation layer 20 is deposited over the semiconductor substrate 10 and the contact pad 16 and the dummy pad 18. In an embodiment, the passivation layer 20 is masked and etched to have a first opening 201 and a second opening 202 exposing portions of the contact pad 16 and the dummy pad 18, respectively. In some embodiments, the passivation layer 20 includes a dielectric layer, a polymer layer, or combinations thereof. The passivation layer 20 may be a single layer or a laminated layer.

Figure 3:
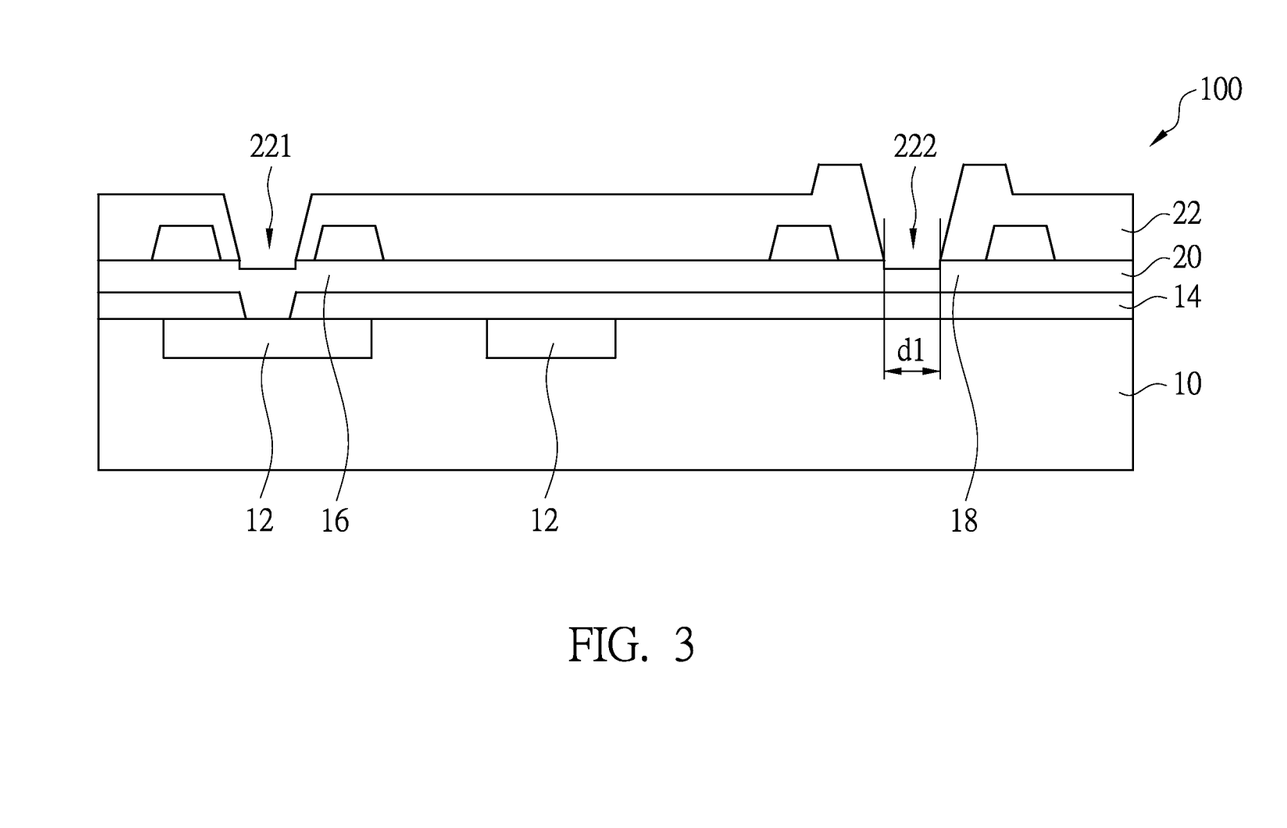

FIG. 3 is a cross-sectional view illustrating formation of a protective layer 22 according to an embodiment.

The protective layer 22 is formed on the passivation layer 20. In an embodiment, the protective layer 22 is masked and etched to form a third opening 221 and a fourth opening 222. The third opening 221 is formed within the first opening 201, such that the protective layer 22 contacts a part of the contact pad 16 through the first opening 201 and exposes part of the contact pad 16. Similarly, the fourth opening 222 is formed within the second opening 202, such that the protective layer 22 contacts a part of the dummy pad 18 through the second opening 202 and expose part of the dummy pad 18. In an embodiment, a diameter (d1) of the fourth opening 222 in the protective layer 22 is in a range about 20 μm to about 100 μm. In some embodiments, the protective layer 22 is formed of polymer, polyimide, nitride, oxide or other non-conductive layer. The protective layer 22 may be a single layer or a laminated layer.

Figure 4:
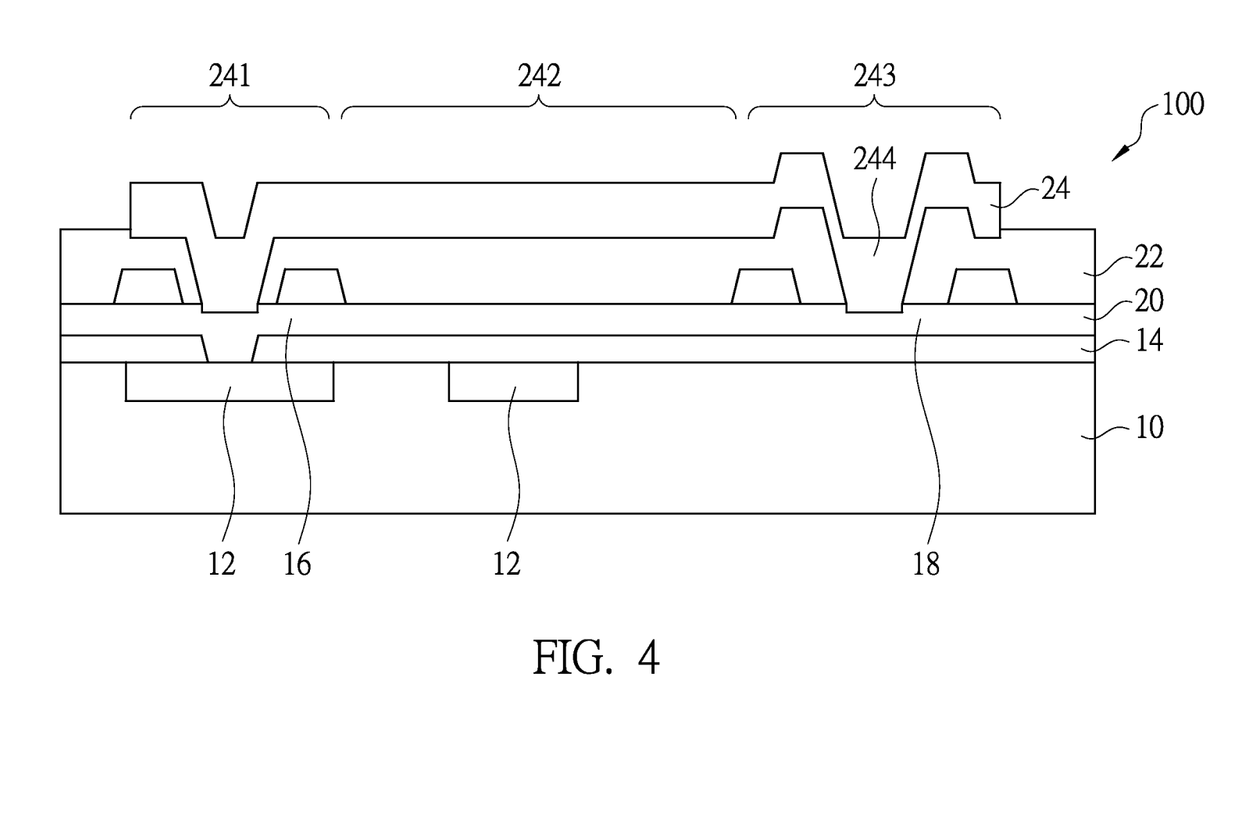

FIG. 4 is a cross-sectional view illustrating formation of an interconnect structure 24 according to an embodiment.

The interconnect structure 24, also referred to as a post-passivation interconnect (PPI) structure 24, is formed on the protective layer 22 and contacts the exposed portions of the contact pad 16 and the dummy pad 18 through the openings 221 and 222, respectively. In an embodiment, the PPI structure 24 includes three continuously-connected portions 241, 242 and 243. The portion 241 is a contacting pad portion 241, positioned over the contact pad 16 and electrically connecting the contact pad 16 through the opening 221. The portion 243 is a mounting pad portion 243, positioned over the dummy pad 18 and contacting the dummy pad 18 through the opening 222. The mounting pad portion 243 includes at least one contact via 244 formed in the opening 222 of the protective layer 22 and contacting the dummy pad 18. The portion 242 is a trace portion 242, positioned between the two portions 241 and 243. In some embodiments, the PPI structure 24 includes at least one conductive layer formed of Al, Cu, Al alloy, Cu alloy, titanium (Ti), tantalum (Ta), titanium nitride (TiN), tantalum nitride (TaN), titanium tungsten (TiW), chromium (Cr), nickel (Ni), gold (Au), or combinations thereof. From the cross-sectional view, FIG. 4 illustrates only one contact via 244 in the opening 222 of the protective layer 22. There may be a plurality of such contact vias in top down views.

Figure 5A:
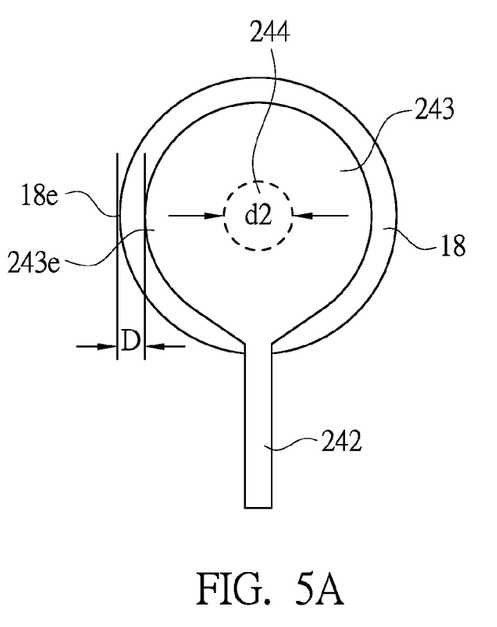
FIGS. 5A through 5C illustrate examples of post-passivation interconnect (PPI) structures in top down views.
Figure 5B:
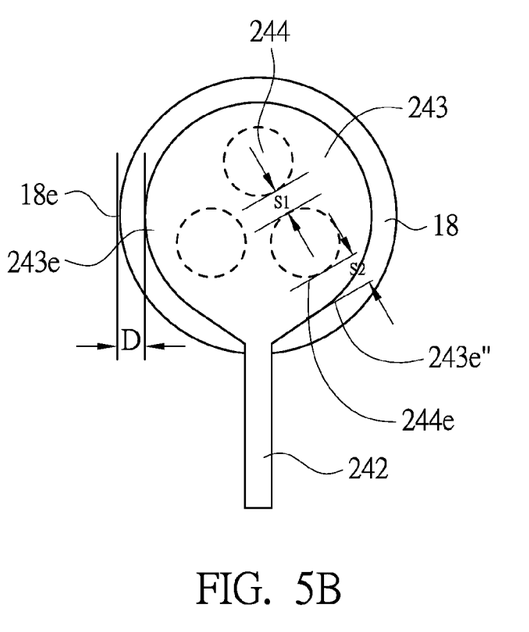
Figure 5C:
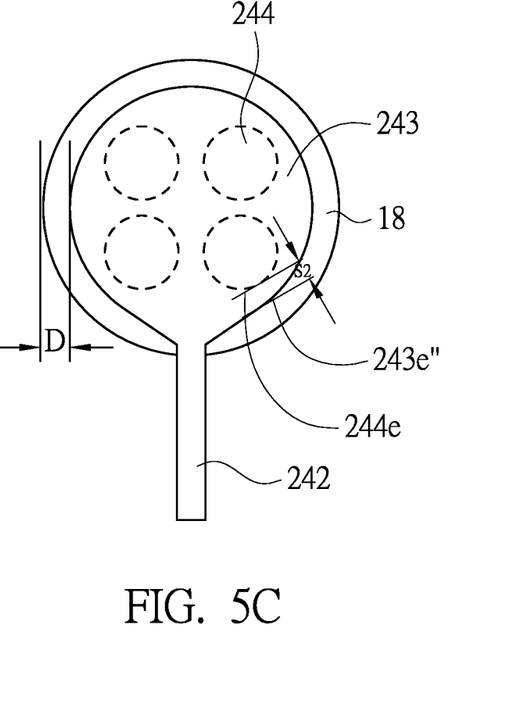

FIGS. 5A through 5C illustrate examples of the mounting pad portion 243 and the dummy pad 18 in top down views.

FIG. 5A illustrates the mounting pad portion 243 with only one contact via 244 contacting the dummy pad 18. The contact via 244 can be shaped as a circular shape, a rectangular shape, a square shape, a polygon shape or the like. For example, a diameter (d2) of the contact via 244 is in a range about 20 μm to about 100 μm. In an embodiment, the size of the mounting pad portion 243 is smaller than the size of the dummy pad 18. The corresponding position between the mounting pad portion 243 and the dummy pad 18 can be adjusted to meet requirements in device performance and process control. For example, a distance D from one end 243e of the mounting pad portion 243 to an edge 18e of the dummy pad 18 adjacent to the end 243e, also referred to as an enclosure size, is about 5 μm or greater.

FIG. 5B illustrates the mounting pad portion 243 with three contact vias 244 contacting the dummy pad 18. In the exemplary embodiment, the three contact vias 244 are formed in the three openings 222 of the protective layer 22, respectively. For example, the space S1 between two adjacent contact vias 244 is about 20 μm or greater, and the space S2 between an edge 244e of the contact via 244 and an edge 243e" of the mounting pad portion 243 adjacent to the edge 244e is about 5 μm or greater. In an embodiment, the size of the mounting pad portion 243 is smaller than the size of the dummy pad 18. For example, an enclosure size (distance D) between the mounting pad portion 243 and the dummy pad 18 is about 5 μm or greater.

FIG. 5C illustrates four contact vias 244 on the dummy pad 18. In the exemplary embodiment, the four contact vias 244 are formed in the four openings 222 of the protective layer 22, respectively. For example, the space S2 between an edge 244e of the contact via 244 and an edge 243e" of the mounting pad portion 243 adjacent to the edge 244e is about 5 μm or greater. In an embodiment, the size of the mounting pad portion 243 is smaller than the size of the dummy pad 18. For example, an enclosure size (distance D) between the mounting pad portion 243 and the dummy pad 18 is about 5 μm or greater.

Figure 6:
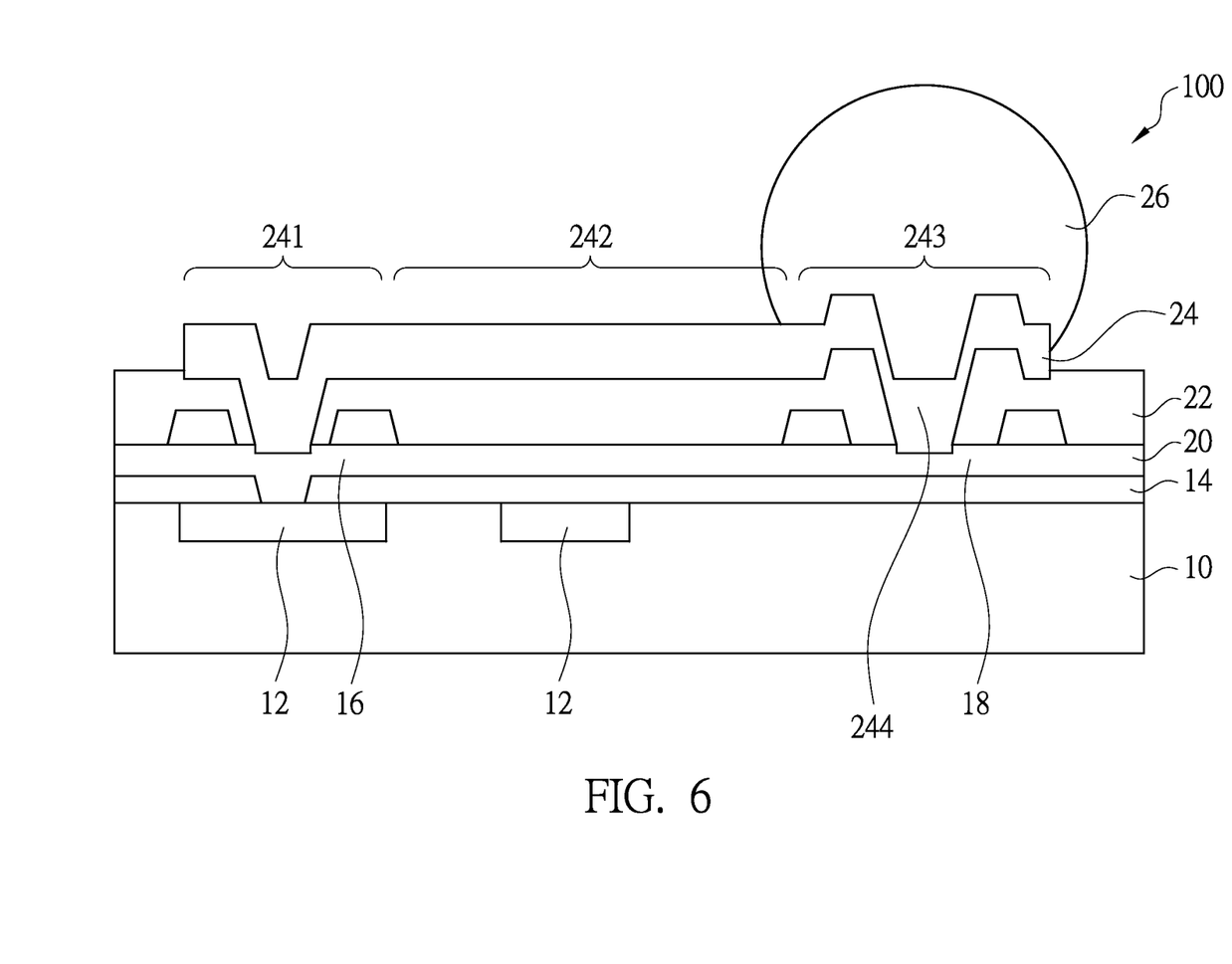
FIG. 6 illustrates a cross-sectional view of a bump formed on a post-passivation interconnect (PPI) structure according to some embodiments.

FIG. 6 illustrates a cross-sectional view of forming a bump 26 on the PPI structure 24 according to some embodiments.

In an embodiment, the bump 26 is applied to the mounting pad portion 243 so that the ball 26 contacts the upper surface of the mounting pad portion 243. For example, the ball 26 may contact and cover all of, or a portion of, the mounting pad portion 243. In an embodiment, the bump 26 is a solder bump formed by attaching a solder ball to the mounting pad portion 243 and then thermally reflowing the solder material. In an embodiment, the solder bump has a diameter greater than about 200 μm. In some embodiments, the solder bump includes a lead-free pre-solder layer, SnAg, or a solder material including alloys of tin, lead, silver, copper, nickel, bismuth, or combinations thereof. In some embodiments, the solder bump is formed by plating a solder layer using photolithography technologies followed by reflow processes.

The bump 26 is in contact with the mounting pad portion 243 and positioned over the contact via 244. Together with designs in forming the opening 222 of the protective layer 22, the contact via 244 can sustain the accurate ball mount location to prevent ball shift during ball mount and/or reflow process and provide stronger support and better adhesion for the solder ball. Moreover, the dummy pad 18 under the contact via 244 and the bump 26 can improve the adhesion between the passivation layer 20 and the PPI structure 24, leading to a more robust interconnect structure under the bump scheme.

Figure 7:
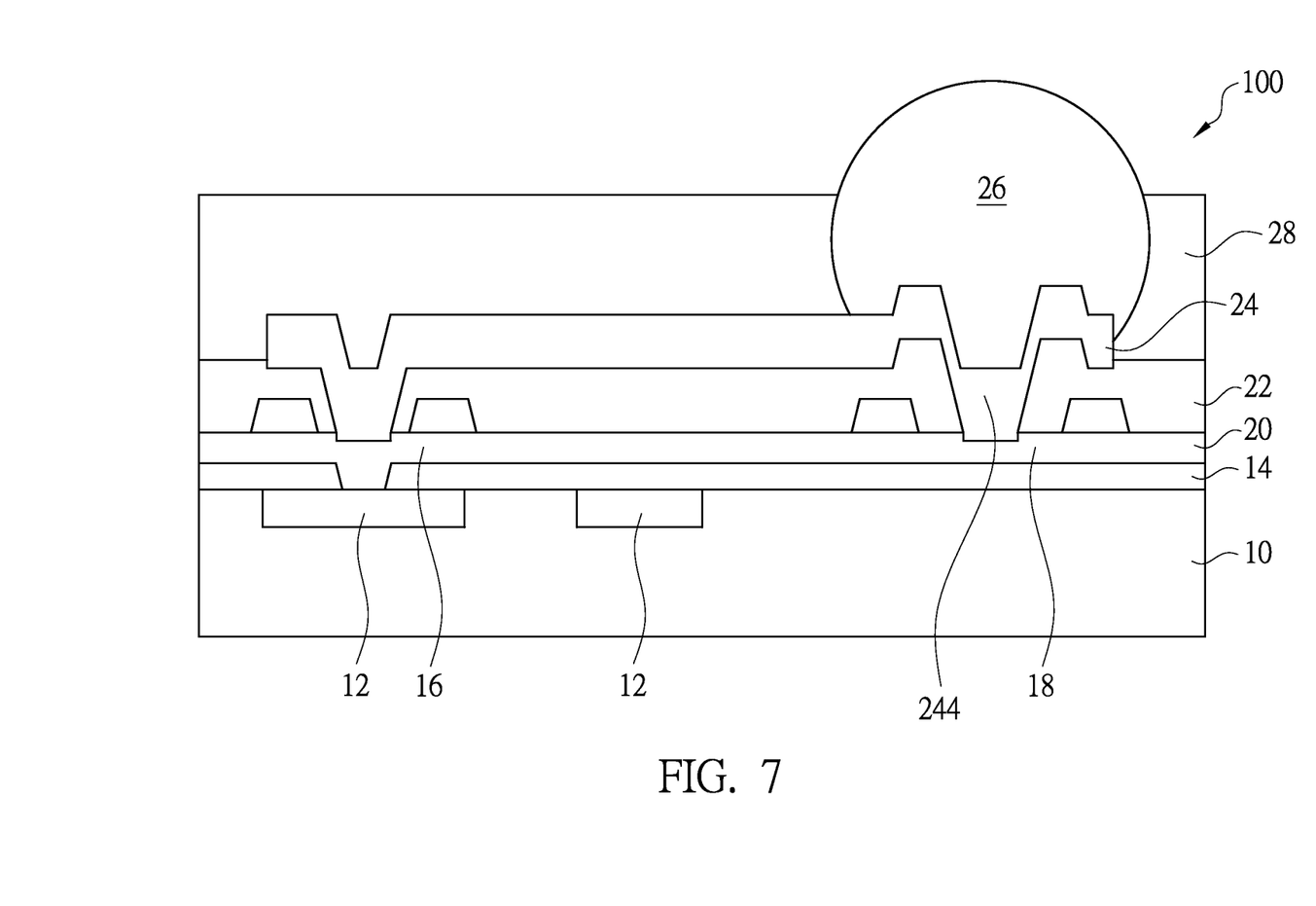
FIG. 7 illustrates a cross-sectional views of molding compound on a bump and a post-passivation interconnect (PPI) structure according to some embodiments.

FIG. 7 is a cross-sectional view of the application of molding compound 28 according to an embodiment.

The molding compound 28 is applied on the PPI structure 24 and the protective layer 22, and the bump 26 is partially buried in the molding compound 28. In some embodiments, the molding compound 28 is in physical contact with a lower portion of the bump 26, while an upper portion of the bump 26 is exposed and protrudes from a top surface of the molding compound 28. In some embodiments, a height of the bump 26 that is buried in the molding compound 28 is between about ¼ to ¾ of a total height of the bump 26. In at least one embodiment, the molding compound 28 is formed by applying a liquid molding compound and performing a curing process to cure and solidify the liquid molding compound. In some embodiments, a release film or a soft material may be applied on the liquid molding compound. Pressure is applied on the release film on the liquid molding compound, so that a portion of the bump 26 is pressed into release film. Furthermore, the pressure applied on the release film may push some of liquid molding compound downward. While the pressure is applied to the release film pushing against the bump and the liquid molding compound, a curing may be performed to cure and solidify liquid molding compound. Thereafter, the release film is peeled off the molding compound 28, which is now in a solid form. The molding compound 28 residue remaining on the top portion of the bump 26 is then etched.

After the bump formation, for example, an encapsulant may be formed on the semiconductor device 100, a singulation process may be performed to singulate individual devices, and wafer-level or die-level stacking or the like may be performed. Embodiments may be used in many different situations. For example, embodiments may be used in a device-to-device bonding configuration, a device-to-wafer bonding configuration, a wafer-to-wafer bonding configuration, device-level packaging, wafer-level packaging, or the like. In some embodiments, the semiconductor device shown in FIG. 7 is flipped upside down and attached to another substrate, forming a package assembly. The process shown in FIGS. 1-7 is only for illustration purposes, and are not limiting. There may be many variations of processing steps and processing materials that can be readily seen by those skilled in the art.

Figure 8:
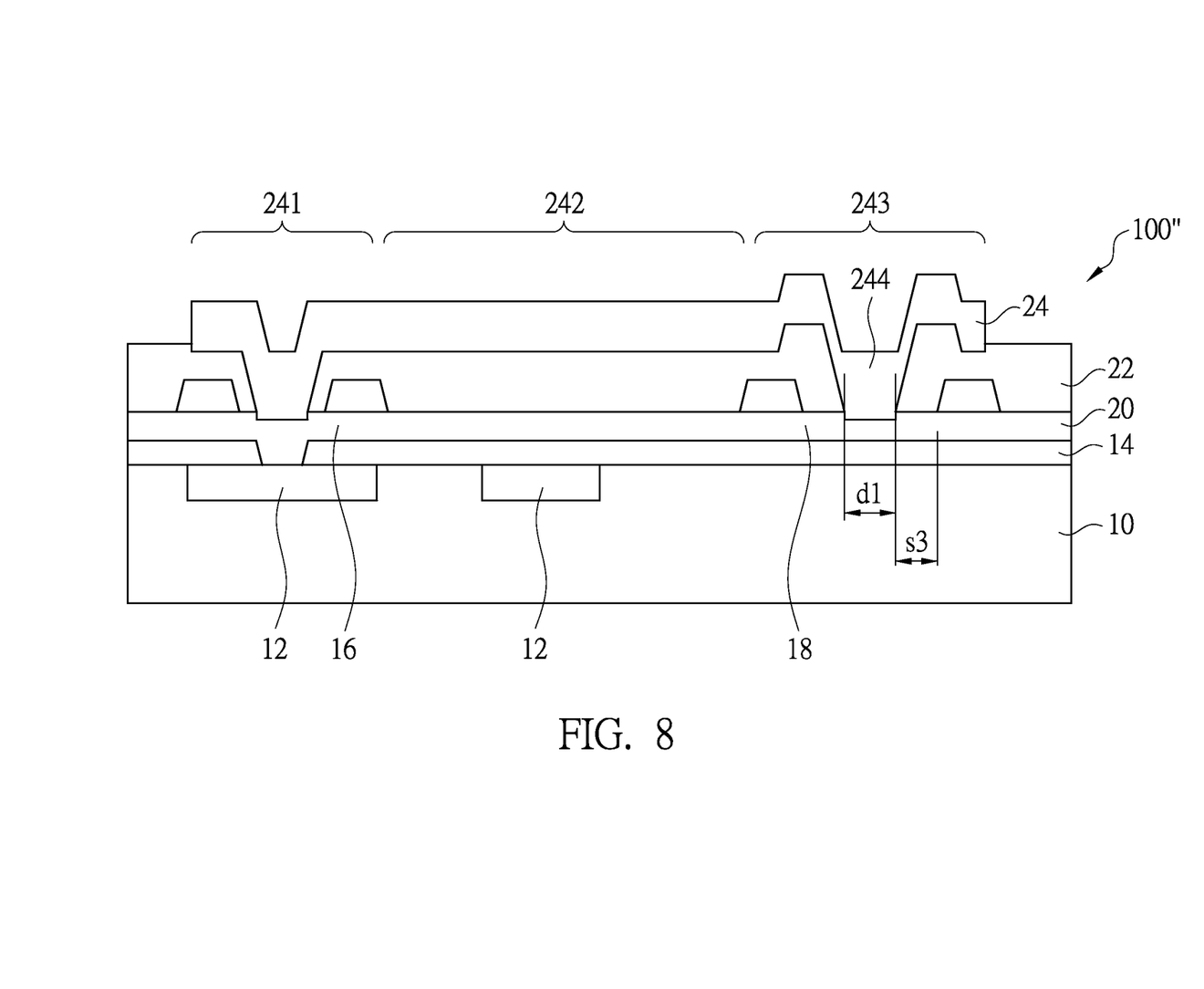
FIG. 8 illustrates a cross-sectional view of a post-passivation interconnect (PPI) structure according to another embodiment.

FIG. 8 is a cross-sectional view illustrating another embodiment of a semiconductor device 100" including a PPI structure 24 on a dummy pad 18. The process forming the structure shown in FIG. 8 has part overlap with the process shown in FIGS. 1-4. Description in FIGS. 1-4 can be similarly applied to the overlap part shown in FIG. 8.

Figure 9:
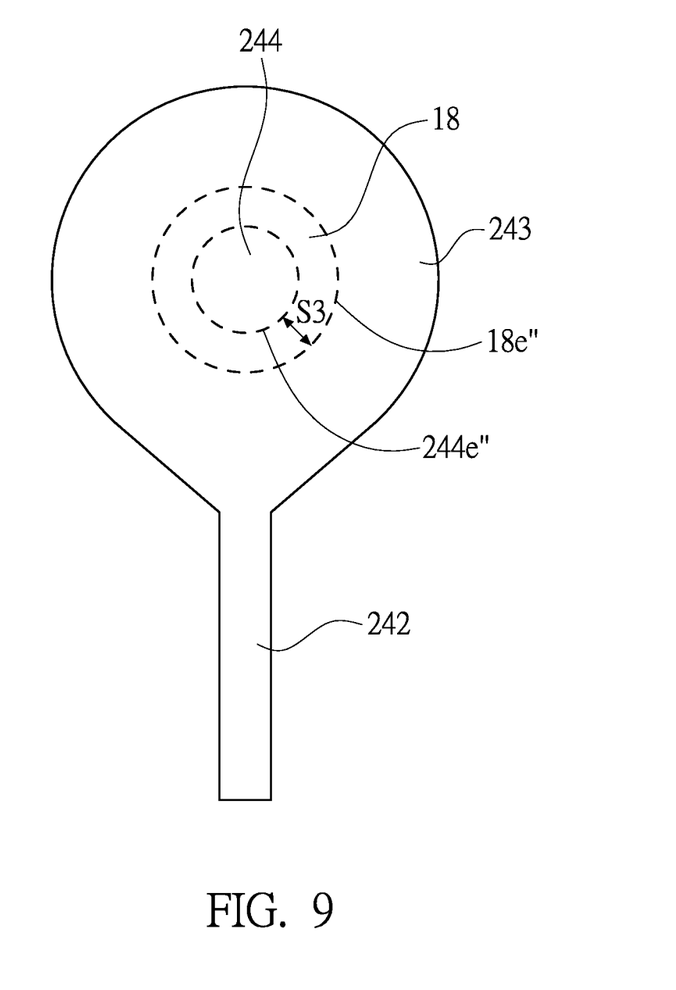
FIG. 9 illustrates an example of a post-passivation interconnect (PPI) structure shown in FIG. 8 in top down views.

The protective layer 22 has the opening 222 exposing part of the dummy pad 18. In an embodiment, a diameter (d1) of the opening 222 in the protective layer 22 is in a range about 20 μm to 100 μm. The PPI structure 24 is formed on the protective layer 24, and has the mounting pad portion 243 over the dummy pad 18. The mounting pad portion 243 has the contact via 244 formed in the opening 222 and contacts the dummy pad 18. The size of the mounting pad portion 243 is greater than the size of the dummy pad 18. FIG. 9 illustrates an example of the mounting pad portion 243 and the dummy pad 18 shown in FIG. 8 in top down views. For example, the space S3 between the edge 244$e''$ of the contact via 244 and an edge 18$e''$ of the dummy pad 18 is about 5 μm or greater.

According to an embodiment, a semiconductor device includes a protective layer overlying a contact pad and a dummy pad on a semiconductor substrate, an interconnect structure overlying the protective layer and contacting part of the dummy pad through a contact via passing through the protective layer, a bump overlying the interconnect structure positioned over the dummy pad.

According to another embodiment, a semiconductor device includes a contact pad and a dummy pad overlying a semiconductor substrate; a protective layer overlying the contact pad and the dummy pad, wherein the protective layer has a first opening exposing part of the contact pad and a second opening exposing part of the dummy pad; an interconnect structure overlying the protective layer, wherein the interconnect structure comprises: a first portion positioned over the contact pad and electrically connected to the contact pad through the first opening of the protective layer; and a second portion positioned over the dummy pad and physically contacting the dummy pad through the second opening of the protective layer; and a bump physically contacting the second portion of the interconnect structure.

According to another embodiment, a method of forming a semiconductor device, includes steps of forming a contact pad over a semiconductor substrate; forming a dummy pad over a semiconductor substrate, spaced apart from the contact pad; forming a polymer layer overlying the contact pad, the dummy pad and the semiconductor substrate; forming a first opening in the polymer layer, exposing a portion of the contact pad; forming a second opening in the polymer layer, exposing a portion of the dummy pad; forming a conductive layer overlying the polymer layer and contacting the exposed portions of the contact pad and the dummy pad through the first opening and the second opening; and forming a bump on the conductive layer, positioned over the dummy pad.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
    a contact pad and a dummy pad overlying a semiconductor substrate;
    a protective layer overlying the contact pad and the dummy pad;
    an interconnect structure overlying the protective layer and comprising a mounting pad portion positioned over the dummy pad, wherein the mounting pad portion comprises a contact via passing through the protective layer and contacting part of the dummy pad; and
    a bump overlying the mounting pad portion of the interconnect structure.

2. The semiconductor device of claim 1, wherein the interconnect structure comprises a contacting pad portion positioned over the contact pad and electrically connected to the contact pad through an opening in the protective layer.

3. The semiconductor device of claim 2, wherein the interconnect structure comprises a trace portion connecting the mounting pad portion and the contacting pad portion.

4. The semiconductor device of claim 1, further comprising a molding compound overlying the interconnect structure and being in physical contact with a lower portion of the bump.

5. The semiconductor device of claim 1, wherein the contact pad and the dummy pad are formed at the same level overlying the semiconductor substrate.

6. The semiconductor device of claim 1, further comprising a passivation layer between the protective layer and the dummy pad.

7. The semiconductor device of claim 1, wherein the contact via has a diameter in a range between about 20 μm and about 100 μm.

8. The semiconductor device of claim 1, wherein the mounting pad portion comprises a plurality of contact vias passing through the protective layer and contacting part of the dummy pad.

9. The semiconductor device of claim 8, wherein a space between two adjacent contact vias is about 20 μm or greater.

10. The semiconductor device of claim 1, wherein a distance from an edge of the mounting pad portion to an edge of the contact via is about 5 μm or greater.

11. The semiconductor device of claim 1, wherein a distance from an edge of the mounting pad portion to an edge of the dummy pad is about 5 μm or greater.

12. The semiconductor device of claim 1, wherein the dummy pad comprises aluminum or aluminum alloy.

13. The semiconductor device of claim 1, wherein the interconnect structure comprises copper or copper alloy.

14. A semiconductor device, comprising:
a contact pad and a dummy pad overlying a semiconductor substrate;
a protective layer overlying the contact pad and the dummy pad, wherein the protective layer has a first opening exposing part of the contact pad and a second opening exposing part of the dummy pad;
an interconnect structure overlying the protective layer, wherein the interconnect structure comprises:
a first portion positioned over the contact pad and electrically connected to the contact pad through the first opening of the protective layer; and
a second portion positioned over the dummy pad and physically contacting the dummy pad through the second opening of the protective layer; and
a bump physically contacting the second portion of the interconnect structure.

15. The semiconductor device of claim 14, wherein the interconnect structure comprises a third portion connecting the first portion and the second portion.

16. The semiconductor device of claim 14, further comprising a molding compound overlying the interconnect structure, wherein the bump is partially buried in the molding compound.

17. The semiconductor device of claim 14, further comprising a passivation layer between the protective layer and the dummy pad.

18. The semiconductor device of claim 14, wherein the protective layer comprises a plurality of second openings, and the second portion of the interconnect structure physically contacts the dummy pad through the plurality of second openings.

* * * * *